(12) United States Patent
Higashijima

(10) Patent No.: US 9,159,594 B2
(45) Date of Patent: Oct. 13, 2015

(54) LIQUID PROCESSING APPARATUS AND LIQUID PROCESSING METHOD

(75) Inventor: Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 827 days.

(21) Appl. No.: 13/351,773

(22) Filed: Jan. 17, 2012

(65) Prior Publication Data
US 2012/0180822 A1 Jul. 19, 2012

(30) Foreign Application Priority Data

Jan. 18, 2011 (JP) ................................. 2011-008047

(51) Int. Cl.
*H01L 21/67* (2006.01)
(52) U.S. Cl.
CPC ...... *H01L 21/67051* (2013.01); *H01L 21/6708* (2013.01)
(58) Field of Classification Search
CPC . B05C 5/02; H01L 21/67051; H01L 21/6708; H01L 21/67023
USPC ................................ 134/94.1, 95.3, 99.1, 144
See application file for complete search history.

(56) References Cited

U.S. PATENT DOCUMENTS

| | | | | |
|---|---|---|---|---|
| 6,159,291 | A * | 12/2000 | Morita et al. | 118/321 |
| 2004/0074526 | A1* | 4/2004 | Aoki et al. | 134/36 |
| 2007/0134431 | A1* | 6/2007 | Hara et al. | 427/437 |

FOREIGN PATENT DOCUMENTS

| | | |
|---|---|---|
| JP | 06-002260 A | 11/1994 |
| JP | 2000-343016 A | 12/2000 |
| JP | 2007-035866 A | 2/2007 |
| JP | 2009-094525 A | 4/2009 |
| JP | 2011-216607 A | 10/2011 |
| JP | 2011-216608 A | 10/2011 |

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Disclosed are a liquid processing apparatus and a liquid processing method that can advance a plurality of nozzle supporting arms into a processing chamber. The liquid processing apparatus includes a processing chamber, a nozzle configured to supply a fluid to a substrate held by a substrate holding unit, a nozzle supporting arm configured to support the nozzle, and an arm standby unit installed adjacent to the processing chamber and configured for the nozzle supporting arm retreating from the processing chamber to stand by. In the liquid processing apparatus, a plurality of nozzle supporting arms are installed and one nozzle supporting arm has a different height level from the other nozzle supporting arms.

8 Claims, 10 Drawing Sheets

LIQUID PROCESSING APPARATUS AND LIQUID PROCESSING METHOD

CROSS-REFERENCE TO RELATED APPLICATIONS

This application is based on and claims priority from Japanese Patent Application No. 2011-008047, filed on Jan. 18, 2011 with the Japanese Patent Office, the disclosure of which is incorporated herein in its entirety by reference.

TECHNICAL FIELD

The present disclosure relates to a liquid processing apparatus and a liquid processing method that perform a liquid processing such as cleaning, etching, plating, or developing of a substrate by supplying a processing liquid to the substrate while rotating the substrate held in a horizontal state.

BACKGROUND

Conventionally, various types of apparatuses are knows as a liquid processing apparatus that performs a liquid processing such as cleaning, etching, plating, or developing of a substrate such as a semiconductor wafer (hereinafter, also referred to as a wafer) by supplying a processing liquid to a surface or a rear surface of the substrate while rotating the substrate held in a horizontal state. See, for example, Japanese Patent Application Laid-Open No. 2009-94525 which discloses a single wafer type liquid processing apparatus in which the processing liquid is supplied to the surface of the substrate rotated and held by the spin chuck, thereby processing the substrate one by one. In the single wafer type liquid processing apparatus, a technology has been known where a fan filter unit (FFU) is installed at an upper side of a processing chamber to deliver a gas such as nitrogen ($N_2$ gas) or clean air from the FFU to the processing chamber in a down-flow mode.

A configuration of the liquid processing apparatus where the FFU is installed at an upper side of a processing chamber will be described with reference to FIGS. 11 and 12. FIG. 11 is a side view illustrating a schematic configuration of a conventional liquid processing apparatus and FIG. 12 is a plan view of the conventional liquid processing apparatus shown in FIG. 11. As shown in FIGS. 11 and 12, the conventional liquid processing apparatus 200 includes a processing chamber (chamber) 210 in which a wafer W is received and liquid processing of received wafer W is performed. As shown in FIGS. 11 and 12, a holding unit 220 that holds and rotates wafer W is installed in processing chamber 210, and a cup 230 is disposed around holding unit 220. In conventional liquid processing apparatus 200, a nozzle 240 that supplies a processing liquid from an upper side of cup 230 to wafer W held by holding unit 220, and an arm 241 that supports nozzle 240 are installed in processing chamber 210. An arm supporting portion 242 which extends substantially vertically is installed at arm 241 to support arm 241. Moreover, arm supporting portion 242 is rotated by a driving mechanism (not shown) forwardly and reversely. As a result, arm 241 is rotatable about arm supporting portion 242 forwardly and reversely, and is rotatably moved about arm supporting portion 242 between an advance position (see a solid line in FIG. 12) where a processing liquid is supplied to a wafer W held by holding unit 220 and a retreat position (see an alternate long and two short dashes line in FIG. 12) where arm 241 is retreated from cup 230 (see an arrow in FIG. 12).

As shown in FIG. 11, a fan filter unit (FFU) 250 is installed at the upper side of processing chamber 210, and gas such as nitrogen ($N_2$ gas) or clean air is delivered from FFU 250 to processing chamber 210 in a down-flow mode at all times. An exhaust unit 260 is provided at the bottom of processing chamber 210 and an atmosphere in processing chamber 210 is exhausted through exhaust unit 260. As described above, gas such as clean air is delivered from FFU 250 to processing chamber 210 in the down-flow mode and the gas is exhausted through exhaust unit 260 to substitute the atmosphere in processing chamber 210.

SUMMARY

An exemplary embodiment of the present disclosure provides a liquid processing apparatus, including: a processing chamber having a substrate holding unit configured to hold a substrate and a cup disposed around the substrate holding unit; a nozzle configured to supply a fluid to the substrate held by the substrate holding unit; a nozzle supporting arm configured to support the nozzle and be movable horizontally between an advance position advancing into the processing chamber and a retreat position retreating from the processing chamber; an arm standby unit installed adjacent to the processing chamber and configured for the nozzle supporting arm retreating from the processing chamber to stand by; and a wall installed between the processing chamber and the arm standby unit to extend vertically, and a plurality of nozzle supporting arms are installed and at least one nozzle supporting arm has a different height level from other nozzle supporting arms.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 11:
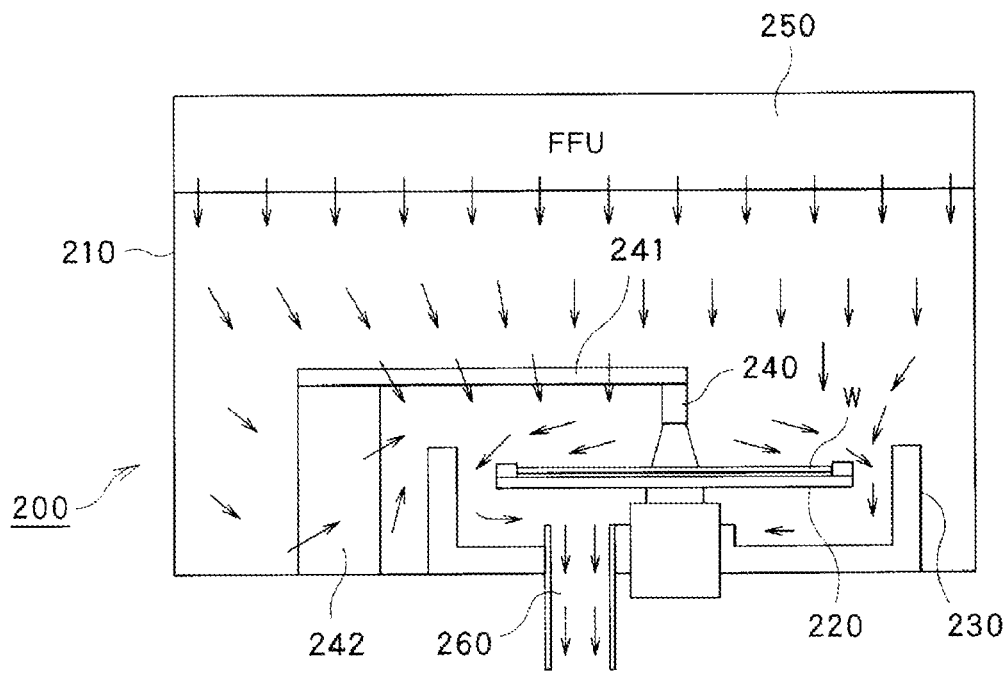
FIG. 11 is a side view illustrating a schematic configuration of a conventional liquid processing apparatus.
Figure 12:
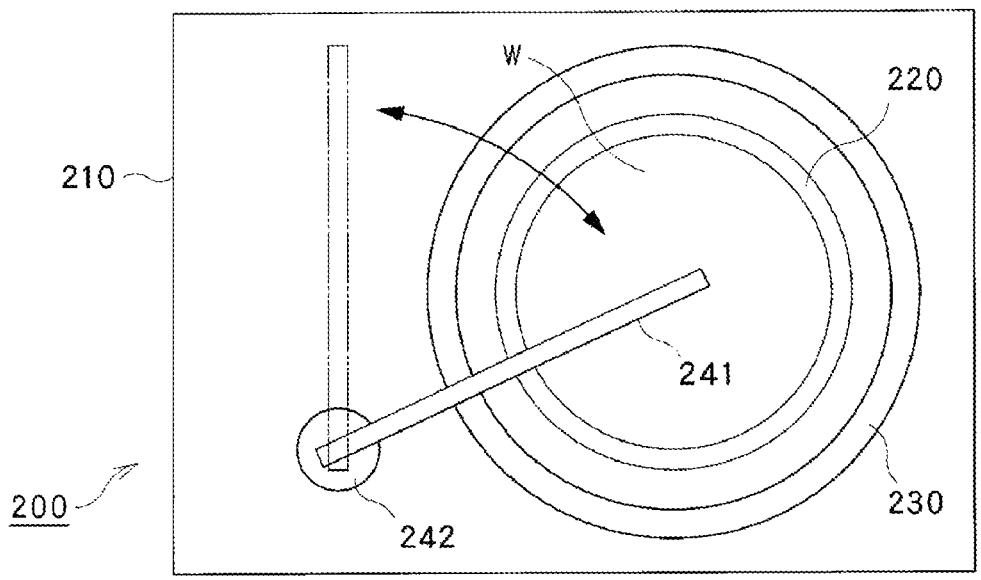
FIG. 12 is a plan view of the conventional liquid processing apparatus shown in FIG. 11.

In conventional liquid processing apparatus 200 shown in FIGS. 11 and 12, arm 241 that supports nozzle 240 or arm supporting portion 242 that supports arm 241 is installed in processing chamber 210. Herein, in conventional liquid processing apparatus 200 shown in FIGS. 11 and 12, a contamination attached to arm 241 may be dropped and attached to wafer W in processing chamber 210. When a chemical liquid are scattered and attached to arm 241 at the time of liquid-processing of wafer W in processing chamber 210, the chemical liquid may remain on arm 241 and a negative influence such as contamination of wafer W may be exerted by an atmosphere of the remaining chemical liquid during subsequent processing of wafer W.

The present disclosure has been made in an effort to provide a liquid processing apparatus and a liquid processing method in which a scattered chemical liquid may be prevented from being attached to a nozzle supporting arm when performing a liquid processing of a substrate by retreating the nozzle supporting arm that supports a nozzle from a processing chamber and standing by in an arm standby unit, and a plurality of nozzle supporting arms may be advanced into the processing chamber.

An exemplary embodiment of the present disclosure provides a liquid processing apparatus, including: a processing chamber having a substrate holding unit configured to hold a substrate and a cup disposed around the substrate holding unit; a nozzle configured to supply a fluid to the substrate held by the substrate holding unit; a nozzle supporting arm configured to support the nozzle and be movable horizontally between an advance position advancing into the processing chamber and a retreat position retreating from the processing chamber; an arm standby unit installed adjacent to the processing chamber and configured for the nozzle supporting arm retreating from the processing chamber to stand by; and a wall installed between the processing chamber and the arm standby unit to extend vertically, and a plurality of nozzle supporting arms are installed and at least one nozzle supporting arm has a different height level from other nozzle supporting arms.

According to the liquid processing apparatus, since the plurality of nozzle supporting arms are installed and at least one nozzle supporting arm has a different height level from other nozzle supporting arms, two or more nozzle supporting arms can be prevented from colliding with each other even though the two or more nozzle supporting arms having different height levels advance into the processing chamber.

In the liquid processing apparatus of the exemplary embodiment of the present disclosure, the plurality of nozzle supporting arms having different height levels may advance into the processing chamber simultaneously.

Specifically, a first nozzle supporting arm that supports a first nozzle for supplying a first fluid may have a different height level from a second nozzle supporting arm that supports a second nozzle for supplying a second fluid of a different type from the first fluid, and when the second fluid is supplied to a location on a substrate to which the first fluid is supplied after the first fluid has been supplied to the substrate held by the substrate holding unit, the first nozzle supporting arm and the second nozzle supporting arm may advance into the processing chamber simultaneously.

In this case, the first fluid may be IPA, the second fluid may be gas, and the IPA may be supplied to the substrate held by the substrate holding unit as the first fluid, and thereafter, the gas may be supplied as the second fluid to a location on the substrate to which the IPA is supplied to dry the substrate.

A first nozzle supporting arm that supports a first nozzle for supplying a first fluid has a different height level from a second nozzle supporting arm that supports a second nozzle for supplying a second fluid of a different type from the first fluid, and when the second fluid is supplied to a substrate continuously after the first fluid has been supplied to the substrate held by the substrate holding unit, the first nozzle supporting arm and the second nozzle supporting arm may advance into the processing chamber simultaneously.

In this case, the first fluid may be a chemical liquid and the second fluid may be water, and the chemical liquid and the water are successively supplied to the substrate held by the substrate holding unit so that the chemical liquid processing and the rinsing processing are performed successively with the substrate.

In the liquid processing apparatus of the present disclosure, each nozzle supporting arm may be configured to linearly move between the inside of the processing chamber and the arm standby unit.

Another exemplary embodiment of the present disclosure provides a liquid processing method, including: holding a substrate by a substrate holding unit installed in a processing chamber; advancing a nozzle supporting arm that supports a nozzle into the processing chamber; and supplying a fluid to the substrate held by the substrate holding unit by using the nozzle of the nozzle supporting arm that advances into the processing chamber, and a plurality of nozzle supporting arms are installed and a first nozzle supporting arm that supports a first nozzle for supplying a first fluid has a different height level from a second nozzle supporting arm that supports a second nozzle for supplying a second fluid of a different type from the first fluid, and when the first fluid is supplied to the substrate held by the substrate holding unit, the first nozzle supporting arm and the second nozzle supporting arm advance into the processing chamber simultaneously so that the second nozzle is positioned around a fluid discharging position by the first nozzle.

According to the exemplary embodiments of the present disclosure, the liquid processing apparatus and the liquid processing method can allow the plurality of nozzle supporting arms to advance into the processing chamber.

Figure 1:
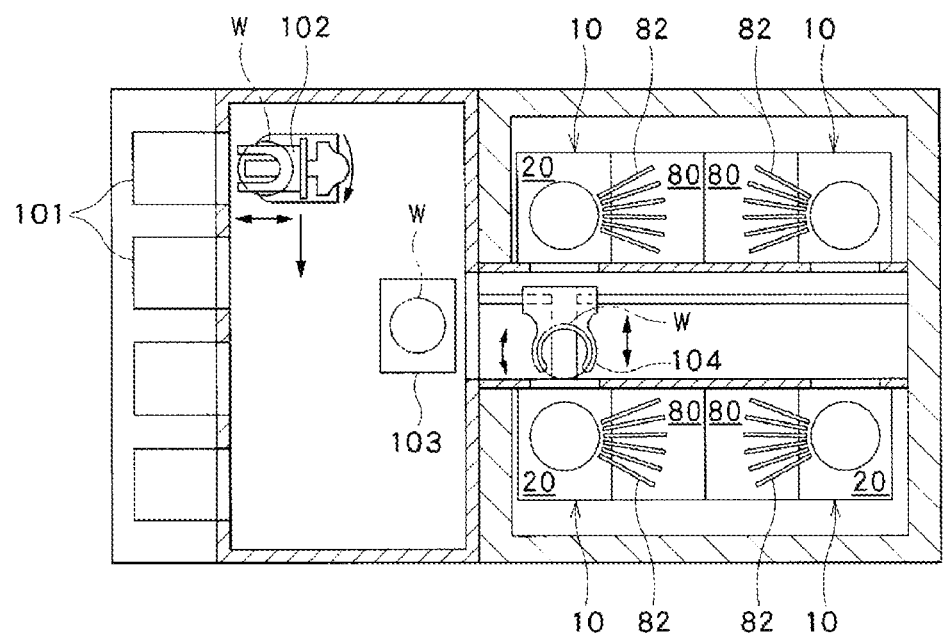
FIG. 1 is a plan view of a liquid processing system including a liquid processing apparatus according to an exemplary embodiment of the present disclosure when viewed from above.
Figure 2:
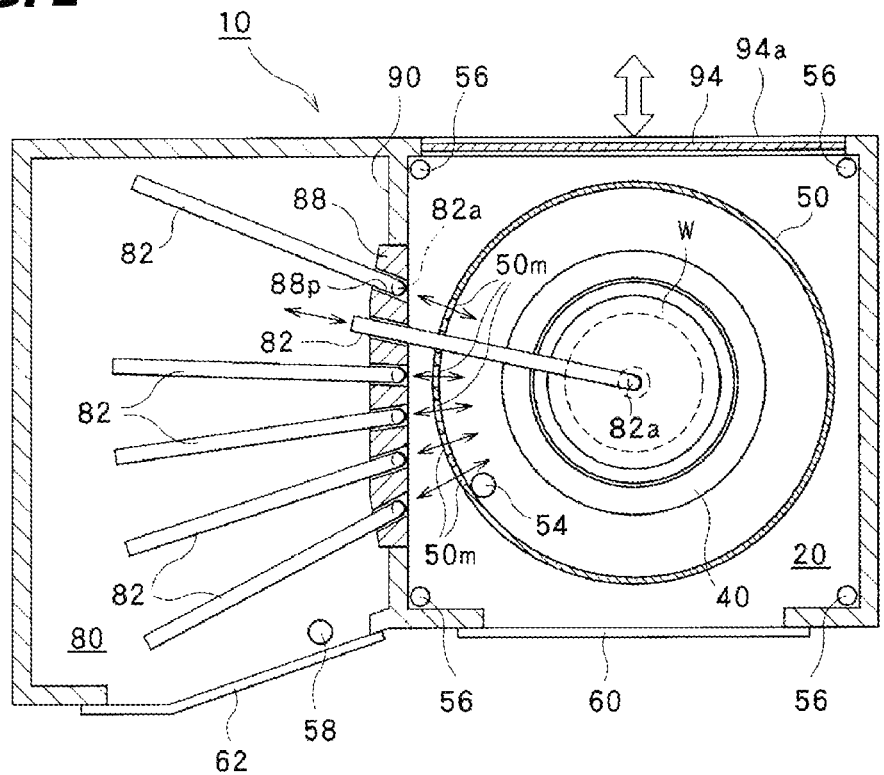
FIG. 2 is a plan view illustrating a schematic configuration of the liquid processing apparatus according to the exemplary embodiment of the present disclosure.
Figure 3:
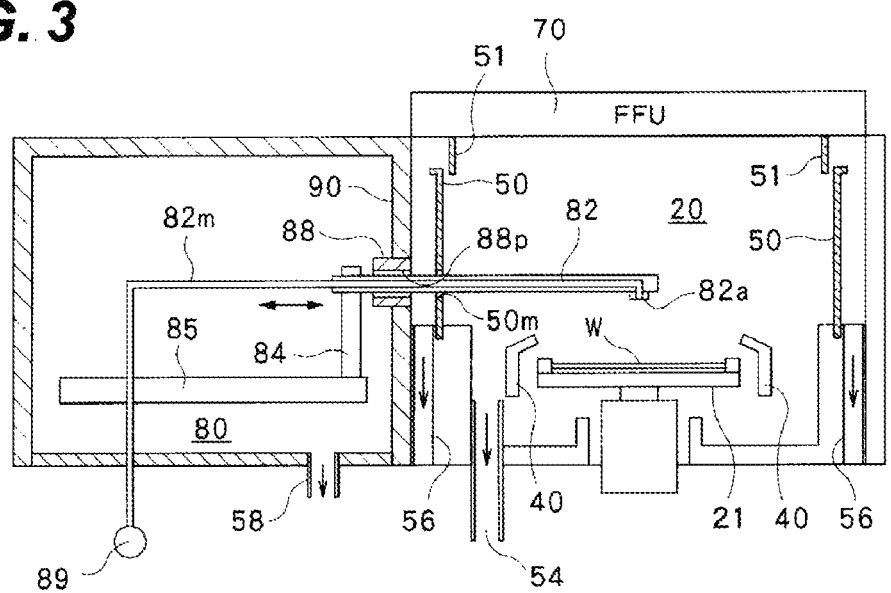
FIG. 3 is a side view of the liquid processing apparatus shown in FIG. 2.
Figure 4:
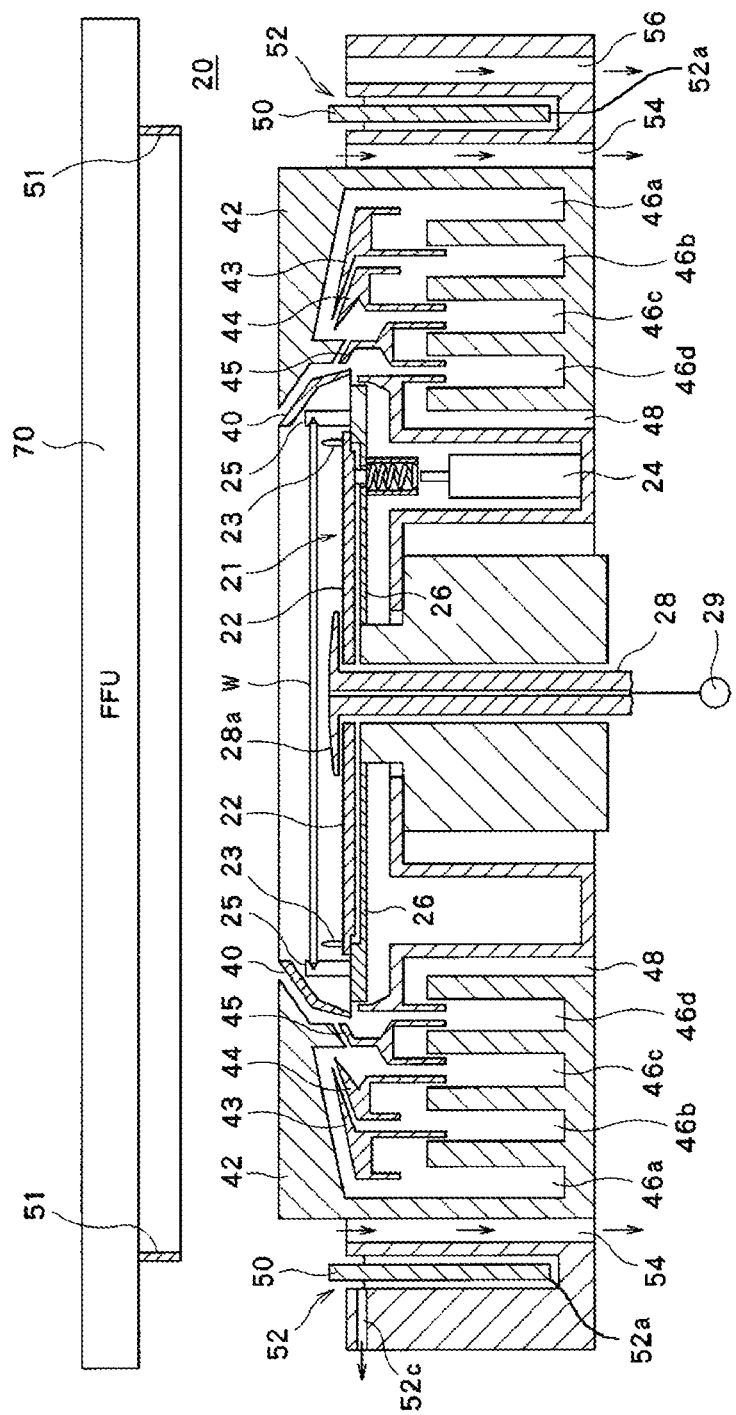
FIG. 4 is a longitudinal cross-sectional view specifically illustrating a configuration of the liquid processing apparatus shown in FIG. 2 and a diagram illustrating a state in which a cup peripheral case is at a lower position.
Figure 5:
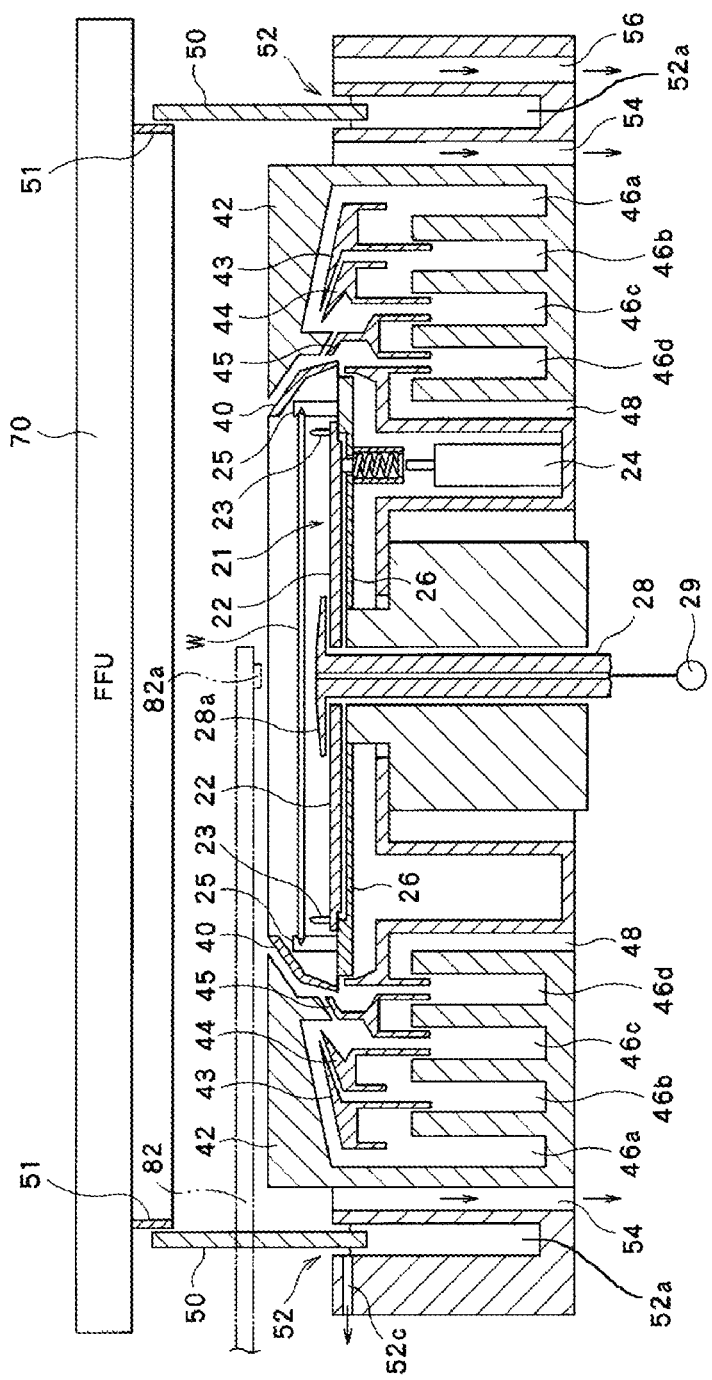
FIG. 5 is a longitudinal cross-sectional view illustrating the configuration of the liquid processing apparatus shown in FIG. 2 in detail and a diagram illustrating a state in which the cup peripheral case is at an upper position.
Figure 6A:
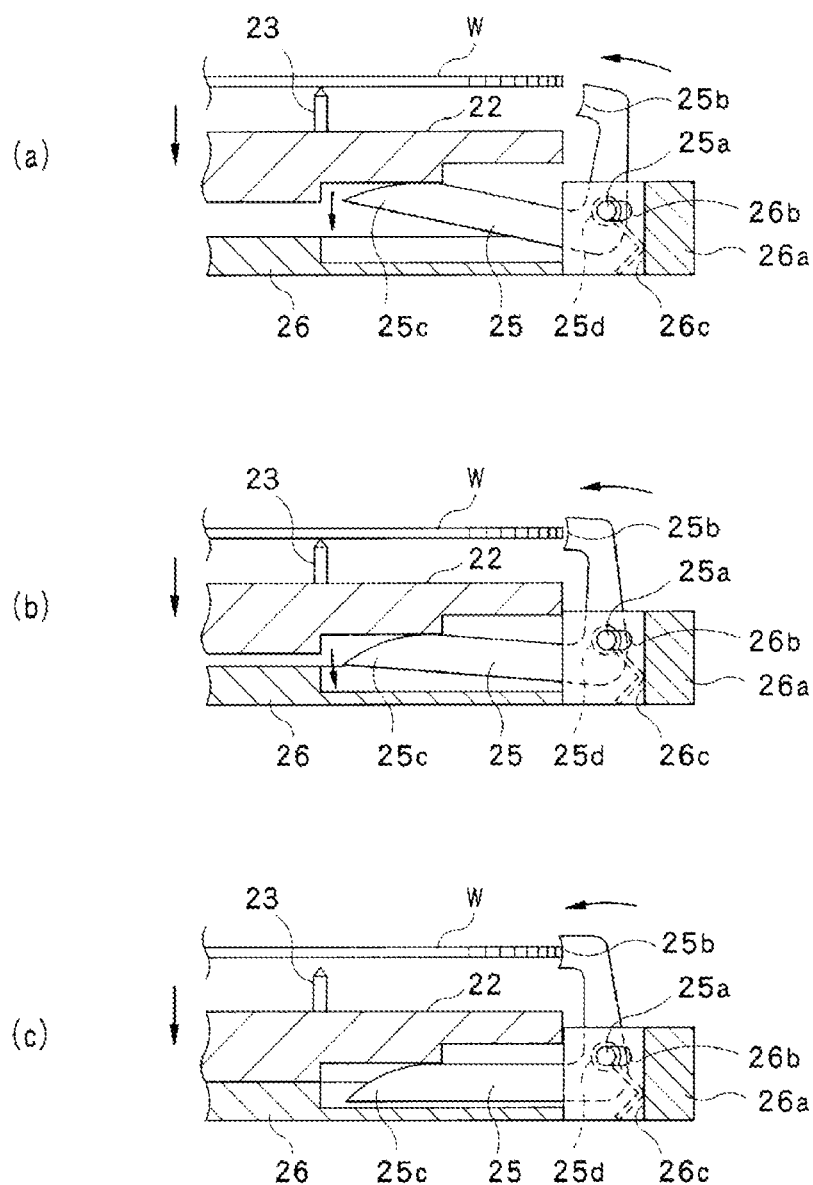
FIG. 6A(a) is an enlarged longitudinal cross-sectional view illustrating a configuration of a holding member installed on a holding plate in the liquid processing apparatus shown in FIG. 4, FIG. 6A(b) is an enlarged longitudinal cross-sectional view illustrating a state when a lift-pin plate moves downward from the state shown in FIG. 6A(a), and FIG. 6A(c) is an enlarged longitudinal cross-sectional view illustrating a state when the lift-pin plate moves further downward from the state shown in FIG. 6A(b).
Figure 6B:
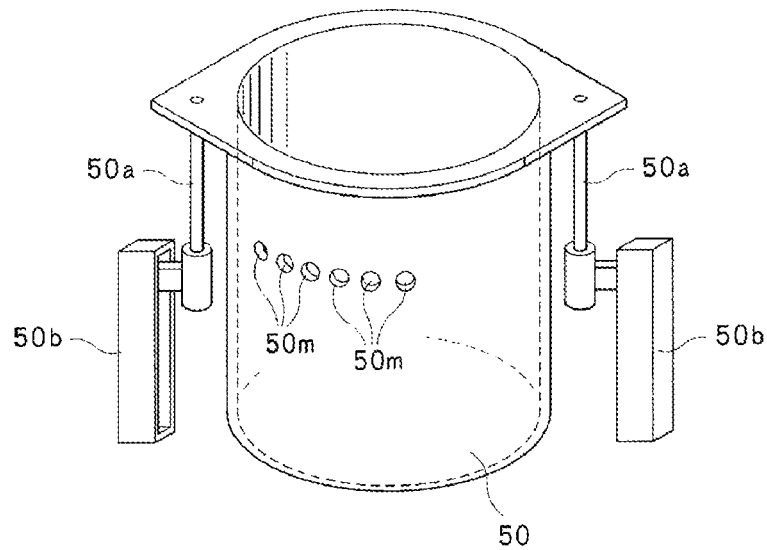
FIG. 6B is a perspective view illustrating a configuration of the cup peripheral case in the liquid processing apparatus shown in FIG. 4.

Hereinafter, exemplary embodiments of the present disclosure will be described with reference to the accompanying drawings. FIGS. 1 to 10 illustrate a liquid processing apparatus according to an exemplary embodiment of the present disclosure. More specifically, FIG. 1 is a plan view of a liquid processing system including a liquid processing apparatus according to an exemplary embodiment of the present disclosure when viewed from above. FIG. 2 is a plan view illustrating a schematic configuration of the liquid processing apparatus according to the exemplary embodiment of the present disclosure, and FIG. 3 is a side view illustrating the schematic configuration of the liquid processing apparatus shown in FIG. 2. FIGS. 4 and 5 are longitudinal cross-sectional views illustrating the configuration of the liquid processing apparatus shown in FIG. 2 in detail. FIG. 6A is an enlarged longitudinal cross-sectional view illustrating a configuration of a holding member installed on a holding plate in the liquid processing apparatus shown in, for example, FIG. 4, and FIG. 6B is a perspective view illustrating a configuration of the cup peripheral case in the liquid processing apparatus shown in, for example, FIG. 4. FIGS. 7 to 10 are views illustrating a configuration of a nozzle supporting arm installed in the liquid processing apparatus shown in, for example, FIG. 2.

First, referring to FIG. 1, the liquid processing system including the liquid processing apparatus according to the exemplary embodiment of the present disclosure will be described. As shown in FIG. 1, the liquid processing system includes a placing table 101 configured to place a carrier thereon, in which the carrier receives a substrate W such as a semiconductor wafer (hereinafter, also referred to as a wafer W) as a substrate to be processed from the outside, a transfer arm 102 configured to extract wafer W received in the carrier, a rack unit 103 configured to mount wafer W extracted by transfer arm 102, and a transfer arm 104 configured to receive wafer W placed on rack unit 103 and transfers wafer W into a liquid processing apparatus 10. As shown in FIG. 1, in the liquid processing system, a plurality of (four in the exemplary embodiment shown in FIG. 1) liquid processing apparatuses 10 are installed.

Next, a schematic configuration of liquid processing apparatus 10 according to the exemplary embodiment of the present disclosure will be described with reference to FIGS. 2 and 3.

As shown in FIGS. 2 and 3, liquid processing apparatus 10 according to the exemplary embodiment of the present disclosure includes a processing chamber (chamber) 20 in which wafer W is received and liquid processing of received wafer W is performed. As shown in FIG. 3, a holding unit (substrate holding unit) 21 that holds and rotates wafer W horizontally is installed in processing chamber 20 and a ring-shaped rotational cup 40 is disposed around holding unit 21. As shown in FIGS. 2 and 3, a cup peripheral case 50 having a cylindrical shape is disposed around rotational cup 40 in processing chamber 20. As described below, cup peripheral case 50 may be elevated/descended according to the processing status of wafer W. Configurations of holding unit 21, rotational cup 40, and cup peripheral case 50 will be described below in detail.

In liquid processing apparatus 10, a nozzle 82a that supplies a fluid such as a processing liquid or $N_2$ gas from the upper side of wafer W to wafer W held by holding unit 21 and a nozzle supporting arm 82 that supports nozzle 82a are installed. As shown in FIG. 2, a plurality of (specifically, for example, six) nozzle supporting arms 82 are installed in a one liquid processing apparatus 10 and nozzle 82a is installed at the front end of each nozzle supporting arm 82. As shown in FIG. 3, an arm supporting unit 84 is installed at each of nozzle supporting arms 82 and each arm supporting unit 84 is configured to be driven in a left and right direction in FIG. 3 by an arm driving mechanism 85 to be described below. Therefore, each of nozzle supporting arms 82 is rectilinearly moved in a horizontal direction between an advance position where nozzle 82a advances into processing chamber 20 and a retreat position where nozzle 82a retreats from processing chamber 20 (see arrows indicated on each of nozzle supporting arms 82 in FIGS. 2 and 3). As shown in FIG. 3, a surface processing liquid supplying pipe 82m is installed in each of nozzle supporting arms 82 and each of surface processing liquid supplying pipes 82m is connected to a surface processing liquid supplying unit 89. The fluid such as the processing liquid or $N_2$ gas is supplied to nozzle 82a of each of nozzle supporting arms 82 from surface processing liquid supplying unit 89 through each of surface processing liquid supplying pipes 82m.

As shown in FIGS. 2 and 3, in liquid processing apparatus 10, an arm standby unit 80 is installed adjacent to processing chamber 20. Nozzle supporting arm 82 that has retreated from processing chamber 20 stands by in arm standby unit 80. A wall 90 which is extended in a vertical direction is installed between arm standby unit 80 and processing chamber 20. Wall 90 includes an arm cleaning unit 88 provided with an opening 88p through which each of nozzle supporting arms 82 can pass, respectively. Each of nozzle supporting arms 82 is cleaned by arm cleaning unit 88. A configuration of arm cleaning unit 88 will be described below in detail.

As shown in FIG. 3, a fan filter unit (FFU) 70 is installed at the upper side of processing chamber 20 and gas such as $N_2$ gas (nitrogen gas) or clean air is delivered to processing chamber 20 from FFU 70 in a down-flow mode. As shown in FIGS. 2 and 3, an exhaust unit 54 is installed inside cup peripheral case 50 on the bottom of processing chamber 20, and an atmosphere in processing chamber 20 is exhausted by exhaust unit 54. As described above, the gas such as clean air is delivered to processing chamber 20 from FFU 70 in the down-flow mode and the gas is exhausted by exhaust unit 54 to substitute the atmosphere in processing chamber 20.

As shown in FIGS. 2 and 3, an exhaust unit 56 is installed outside cup peripheral case 50 on the bottom of processing chamber 20 and the atmosphere in processing chamber 20 is exhausted by exhaust unit 56. An atmosphere outside cup peripheral case 50 in processing chamber 20 may be exhausted by exhaust unit 56. Specifically, exhaust unit inhibits an atmosphere in arm standby unit 80 from traveling into cup peripheral case 50. Exhaust unit 56 inhibits the atmosphere in cup peripheral case 50 from traveling to arm standby unit 80.

As shown in FIGS. 2 and 3, an exhaust unit 58 is installed on the bottom of arm standby unit 80 and the atmosphere in arm standby unit 80 is exhausted by exhaust unit 58. Specifically, it is possible to expel particles generated from an arm driving mechanism 85 (to be described below) for driving each of nozzle supporting arms 82 by exhaust unit 58.

As shown in FIG. 2, maintenance shutters 60 and 62 are installed at entrances of processing chamber 20 and arm standby unit 80 of liquid processing apparatus 10, respectively. Maintenance shutters 60 and 62 are installed in processing chamber 20 and arm standby unit 80, respectively, to maintain devices in processing chamber 20 or arm standby unit 80 individually. Even while wafer W is being processed in processing chamber 20, the devices in arm standby unit 80 may be maintained by opening shutter 62.

As shown in FIG. 2, an opening 94a for carrying in/out wafer W to/from processing chamber 20 by transfer arm 104 is provided on a side wall of liquid processing apparatus 10, and a shutter 94 for opening/closing opening 94a is installed in opening 94a.

In liquid processing apparatus 10 shown in FIG. 2, a region inside cup peripheral case 50 in processing chamber 20 is under minute positive pressure compared to a clean room, while a region outside cup peripheral case 50 in processing chamber 20 is under minute negative pressure compared to the clean room. As a result, in processing chamber 20, the atmospheric pressure of the region inside cup peripheral case 50 is larger than the atmospheric pressure of the region outside cup peripheral case 50.

Next, the configuration of liquid processing apparatus 10 shown in FIGS. 2 and 3 will be described in detail with reference to FIGS. 4 and 5.

As shown in FIGS. 4 and 5, holding unit 21 includes a disk-shaped holding plate 26 that supports wafer W and a disk-shaped lift-pin plate 22 installed at an upper side of holding plate 26. Three lift pins 23 that support wafer W from below are installed on the top surface of lift-pin plate 22 with equal spacing in a circumferential direction. In FIGS. 4 and 5, only two lift pins 23 are shown. A piston mechanism 24 is installed on lift-pin plate 22 and lift-pin plate 22 is elevated/descended by piston mechanism 24. More specifically, when wafer W is put on lift pins 23 or wafer W is extracted from lift pins 23 by transfer arm 104 (see FIG. 1), lift-pin plate 22 is moved upwardly from a position shown in, for example, FIG. 4 by piston mechanism 24 to position lift-pin plate 22 above rotational cup 40. Meanwhile, when wafer W is liquid-processed in processing chamber 20, lift-pin plate 22 is moved to a lower position shown in, for example, FIG. 4 by piston mechanism 24 to position rotational cup 40 around wafer W.

Three holding members 25 that support wafer W at lateral sides are installed on holding plate 26 with equal spacing in the circumferential direction. In FIGS. 4 and 5, only two holding members 25 are shown. When lift-pin plate 22 is moved from the upper position to the lower position shown in FIGS. 4 and 5, each of holding members 25 supports wafer W on lift pins 23 and makes wafer W slightly separated from lift pins 23.

The configurations of lift-pin plate 22 and holding plate 26 will be described in more detail with reference to FIG. 6A. In FIG. 6A, (a) is a diagram illustrating a state while lift-pin plate 22 moves from the upper position to the lower position shown in, for example, FIG. 4, (b) is a diagram illustrating a state when lift-pin plate 22 moves downward from the state shown in (a), and (c) is a diagram illustrating a state when lift-pin plate 22 moves further downward from the state shown in (b) to reach the lower position shown in, for example, FIG. 4.

As shown in FIG. 6A, holding member 25 is pivotably supported on holding plate 26 through a shaft 25a. More specifically, as shown in FIG. 6A, a bearing part 26a is attached to holding plate 26 and shaft 25a is received in a bearing hole 26b installed in bearing part 26a. Bearing hole 26b is configured by an elongate hole that extends horizontally and shaft 25a of holding member 25 may move horizontally along bearing hole 26b. Therefore, holding member 25 may swing around shaft 25a received in bearing hole 26b of bearing part 26a.

A spring member 25d such as a torsion spring is wound on shaft 25a of holding member 25. Spring member 25d applies to holding member 25 force to rotate holding member 25 around shaft 25a in a clockwise direction in FIG. 6A. As a result, when no force is applied to holding member 25, holding member 25 is inclined to holding plate 26, and as a result, a support portion 25b (to be described below) of holding member 25 to support wafer W from the side is distant from the center of holding plate 26.

A linear part extends from spring member 25d wound on shaft 25a and the linear part is locked onto an inner wall surface 26c of bearing part 26a to restore shaft 25a toward the center of holing plate 26. Therefore, shaft 25a is continuously pressed toward the center of holding plate 26 (that is, toward the left direction in FIG. 6A) by the linear part of spring member 25d. As a result, when wafer W having a relatively small diameter is held by holding member 25, shaft 25a is positioned at a position (that is, a left position in FIG. 6A) in bearing hole 26b adjacent to the center of holding plate 26, as shown in FIG. 6A. Meanwhile, when wafer W having a relatively large diameter is held by holding member 25, shaft 25a is moved in a right direction from the position shown in FIG. 6A along bearing hole 26b against the force by the linear part of spring member 25d. The size of the diameter of wafer W represents the size of the diameter of wafer W within an allowable size error.

Holding member 25 includes a support part 25b that supports wafer W from the lateral side and a pressed member 25c installed at an opposite side to support part 25b with respect to shaft 25a. Pressed member 25c is installed between lift-pin plate 22 and holding plate 26 and pressed member 25c is pressed downward by the bottom surface of corresponding lift-pin plate 22 when lift-pin plate 22 is positioned at the lower position or a position adjacent thereto as shown in FIG. 6A.

As shown in FIG. 6A, when lift-pin plate 22 is moved from the upper position to the lower position, pressed member 25c is pressed downward by the bottom surface of corresponding lift-pin plate 22, such that holding member 25 rotates in a counterclockwise direction (an arrow direction in FIG. 6A) in FIG. 6A around shaft 25a. Holding member 25 rotates around shaft 25a, such that support part 25b is moved toward wafer W from the lateral side of wafer W. As a result, when lift-pin plate 22 is reached to the lower position, wafer W is supported from the lateral side by holding member 25 as shown in FIG. 6A(c). Herein, as shown in FIG. 6A(c), when wafer W is supported from the lateral side by holding member 25, wafer W is separated from the front end of lift pin 23 to the upper side to float above lift pin 23. As described above, according to the size of wafer W, shaft 25a may be moved in the right direction from the position shown in FIG. 6A along bearing hole 26b against the force by the linear part of spring member 25d. As a result, even when wafer W having a relatively large size is supported by holding member 25, holding member 25 is movable horizontally, and as a result, holding member 25 may support wafer W from the lateral side without deforming or damaging of wafer W.

Through-holes are formed at the centers of lift-pin plate 22 and holding plate 26 respectively, and a processing liquid supplying pipe 28 is installed to pass through the through-holes. Processing liquid supplying pipe 28 supplies a processing liquid such as a chemical liquid or deionized water to a rear surface of wafer W held by each of holding members 25 of holding plate 26. Processing liquid supplying pipe 28 may elevate/descend by being interlocked with lift-pin plate 22. A head part 28a is formed at an upper end of processing liquid supplying pipe 28 to close the through hole of lift pin plate 22. As shown in FIG. 4, processing liquid supplying unit 29 is connected to processing liquid supplying pipe 28 and the processing liquid is supplied to processing liquid supplying pipe 28 by processing liquid supplying unit 29.

As shown in FIGS. 4 and 5, a ring-shaped rotational cup 40 is disposed around holding unit 21. Rotational cup 40 is attached to holding plate 26 and is rotated integrally with holding plate 26. More specifically, rotational cup 40 is installed to surround wafer W supported by each of holding members 25 of holding plate 26 from the lateral sides and receives the processing liquid laterally scattered from the wafer W when wafer W is liquid-processed.

A drain cup 42, a first guide cup 43, a second guide cup 44, and a third guide cup 45 are installed in sequence from above around rotational cup 40. Drain cup 42 and each of guide cups 43, 44, and 45 are formed in a ring shape. Herein, drain cup 42 is fixed in processing chamber 20. Meanwhile, elevating/descending cylinders (not shown) are connected to each of guide cups 43, 44, and 45 respectively, and guide cups 43, 44, and 45 may be independently elevated/descended by corresponding elevating/descending cylinders.

As shown in FIGS. 4 and 5, a first processing liquid recovering tank 46a, a second processing liquid recovering tank 46b, a third processing liquid recovering tank 46c, and a fourth processing liquid recovering tank 46d are installed at lower sides of drain cup 42 or each of guide cups 43, 44, and 45, respectively. The processing liquid laterally scattered from wafer W during the liquid processing of wafer W is selectively delivered to any one of four processing liquid recovering tanks 46a, 46b, 46c, and 46d according to vertical positions of each of guide cups 43, 44, and 45 based on the type of the processing liquid. Specifically, when all guide cups 43, 44, and 45 are disposed at an upper position (the state as shown in FIGS. 4 and 5), the processing liquid laterally scattered from wafer W is delivered to fourth processing liquid recovering tank 46d. Meanwhile, when only third guide cup 45 is at a lower position, the processing liquid laterally scattered from wafer W is delivered to third processing liquid recovering tank 46c. When second and third guide cups 44 and 45 are disposed at the lower position, the processing liquid laterally scattered from wafer W is delivered to second processing liquid recovering tank 46b. When all guide cups 43, 44, and 45 are at the lower position, the processing liquid laterally scattered from wafer W is delivered to first processing liquid recovering tank 46a.

As shown in FIGS. 4 and 5, an exhaust unit 48 is installed at inner side of fourth processing liquid recovering tank 46d. The vertical positions of guide cups 43, 44, and 45 become predetermined positions, such that an atmosphere around wafer W is exhausted by exhaust unit 48.

In liquid processing apparatus 10 of the exemplary embodiment of the present disclosure, cup peripheral case 50 is installed around drain cup 42 or guide cups 43, 44, and 45 in processing chamber 20. Cup peripheral case 50 may be elevated/descended between a lower position as shown in FIG. 4 and an upper position as shown in FIG. 5. As shown in FIGS. 2 and 3, an opening 50m through which nozzle supporting arm 82 can pass is provided on cup peripheral case 50. When cup peripheral case 50 is at the upper position as shown in FIG. 5, the region inside cup peripheral case 50 is isolated from the outside.

The configuration of cup peripheral case 50 will be described in detail with reference to FIG. 6B. FIG. 6B is a perspective view illustrating the configuration of cup peripheral case 50. As shown in FIG. 6B, openings 50m through which nozzle supporting arms 82 can pass are provided on the side of cup peripheral case 50 according to the number of nozzle supporting arms 82 (for example, when the number of nozzle supporting arms 82 is six, six openings 50m are provided). Support members 50a that support cup peripheral case 50 are connected to the upper portion of cup peripheral case 50 and driving mechanisms 50b that elevate/descend support members 50a are installed in support member 50a. Support members 50a are elevated/descended by driving mechanisms 50b, and as a result, cup peripheral case 50 supported by support members 50a is also elevated/descended.

As shown in FIGS. 4 and 5, a guide member 51 is attached to FFU 70. When cup peripheral case 50 is disposed at the upper position as shown in FIG. 5, guide member 51 is placed to be positioned at a narrow distance on the inward side from cup peripheral case 50. In liquid processing apparatus 10 of the exemplary embodiment of the present disclosure, when cup peripheral case 50 is disposed at the upper position as shown in FIG. 5, the atmospheric pressure inside cup peripheral case 50 is larger than the atmospheric pressure outside cup outer peripheral case 50. Therefore, when cup peripheral case 50 is disposed at the upper position, a down-flow gas in processing chamber 20 generated by FFU 70 is guided from the inside of cup peripheral case 50 to the outside thereof around the upper end of cup peripheral case 50 by guide member 51.

As shown in FIGS. 4 and 5, a cleaning unit 52 that cleans cup peripheral case 50 is installed in processing chamber 20. Cleaning unit 52 has a storage part 52a that receives a cleaning liquid such as deionized water and when cup peripheral case 50 is disposed at the lower position as shown in FIG. 4, cup peripheral case 50 is immersed in the cleaning liquid stored in storage part 52a. Cup peripheral case 50 is immersed in the cleaning liquid stored in storage part 52a, and as a result, cleaning unit 52 cleans cup peripheral case 50. As the cleaning liquid stored in storage part 52a, for example, deionized water having a room temperature or higher, preferably 40° C. or higher, and more preferably 60° C. or higher is used. When the temperature of the cleaning liquid stored in storage part 52a is high, a cleaning effect on cup peripheral case 50 is further increased.

As shown in FIG. 4, when cup peripheral case 50 is at the lower position, most of cup peripheral case 50 is immersed in the cleaning liquid reserved in reserving part 52a. As shown in FIG. 5, even when cup peripheral case 50 is at the upper position, a lower part of cup peripheral case 50 is immersed in the cleaning liquid reserved in reserving part 52a. As a result, when cup peripheral case 50 is at the upper position, water sealing is performed between the cleaning liquid reserved in reserving part 52a and the lower part of cup peripheral case 50 and a space between the upper part of cup peripheral case 50 and guide member 51 is narrowed, and as a result, the inner area of cup peripheral case 50 may be isolated from the outside.

As shown in FIGS. 4 and 5, exhaust unit 54 that exhausts the atmosphere in processing chamber 20 is installed inside cleaning unit 52 and an exhaust unit 56 that exhausts the atmosphere in processing chamber 20 is installed outside cleaning unit 52. By installing exhaust units 54 and 56, all the atmosphere in processing chamber 20 can be exhausted by exhaust units 54 and 56 when cup peripheral case 50 is at the lower position as shown in FIG. 4. Meanwhile, when cup peripheral case 50 is disposed at the upper position as shown in FIG. 5, the region inside cup peripheral case 50 is isolated from the outside, and as a result, the atmosphere inside cup peripheral case 50 can be exhausted by exhaust unit 54 and the atmosphere outside cup peripheral case 50 can be exhausted by exhaust unit 56.

As described above, in the exemplary embodiment of the present disclosure, the plurality of (specifically, for example, six) nozzle supporting arms 82 are installed in one liquid processing apparatus 10 and nozzles 82a are installed at the front ends of each of nozzle supporting arms 82, respectively. Specifically, nozzles 82a supply a first chemical liquid (for example, an acid chemical liquid), a second chemical liquid (for example, an alkaline chemical liquid), deionized water, $N_2$ gas, isopropyl alcohol (IPA), and mist of deionized water to the top surface of wafer W, respectively.

Figure 7:
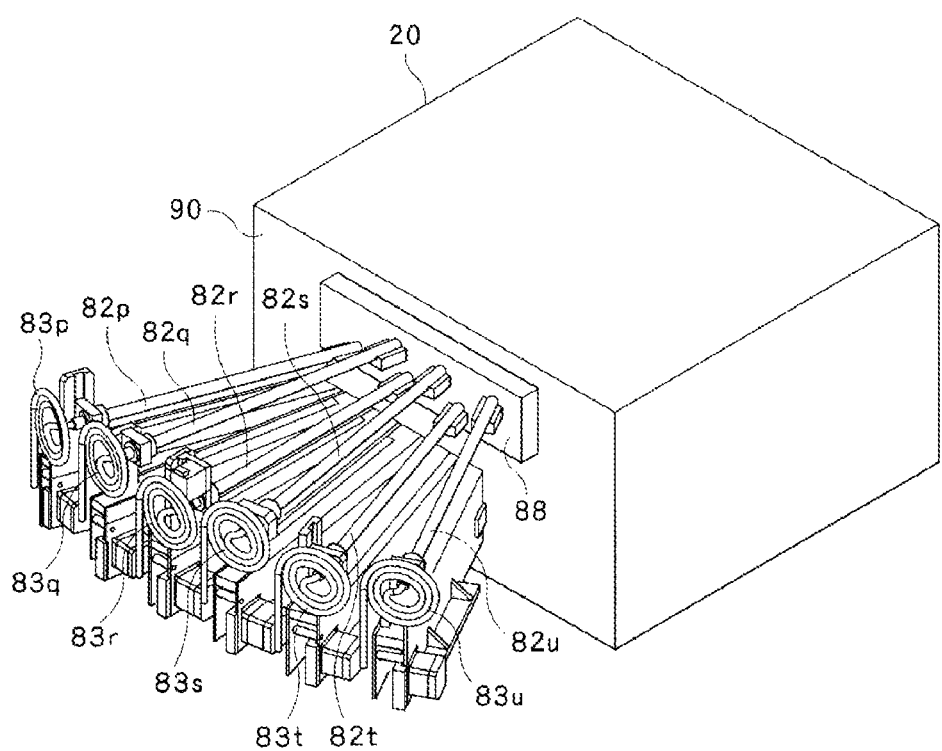
FIG. 7 is a perspective view illustrating a processing chamber and six nozzle supporting arms in the liquid processing apparatus shown in FIG. 2.
Figure 8:
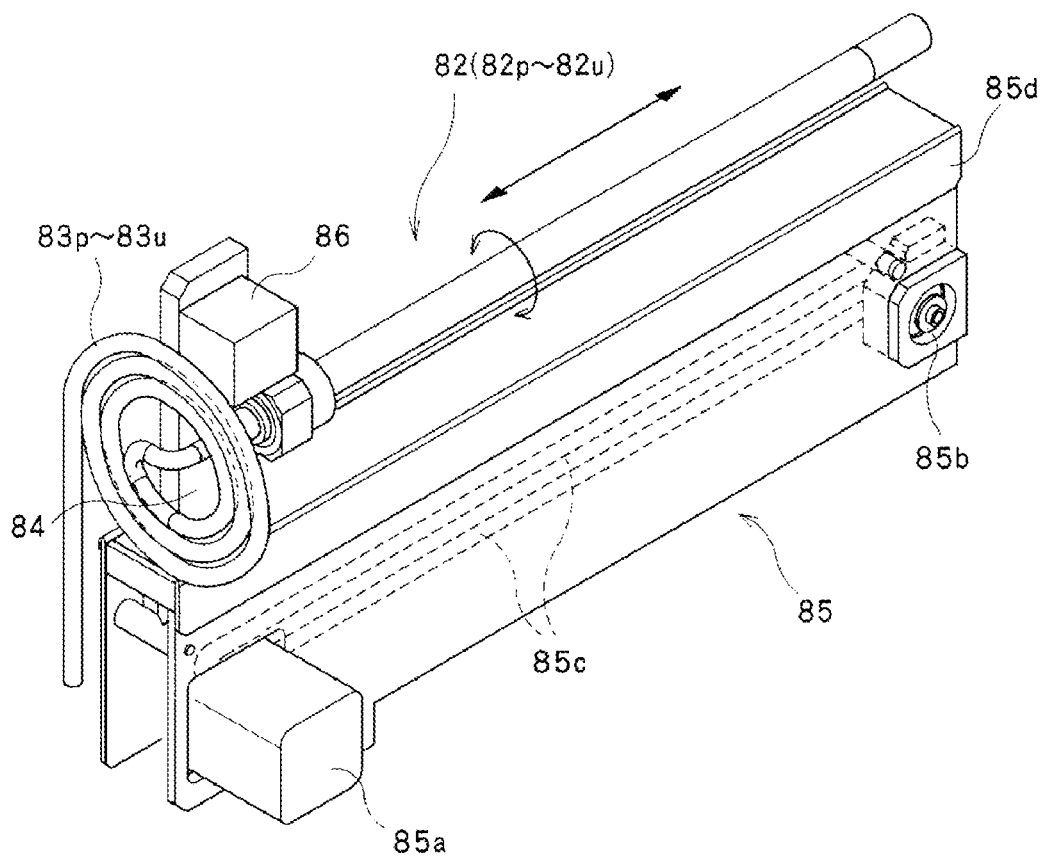
FIG. 8 is an enlarged perspective view of the nozzle supporting arm shown in FIG. 7.
Figure 9:
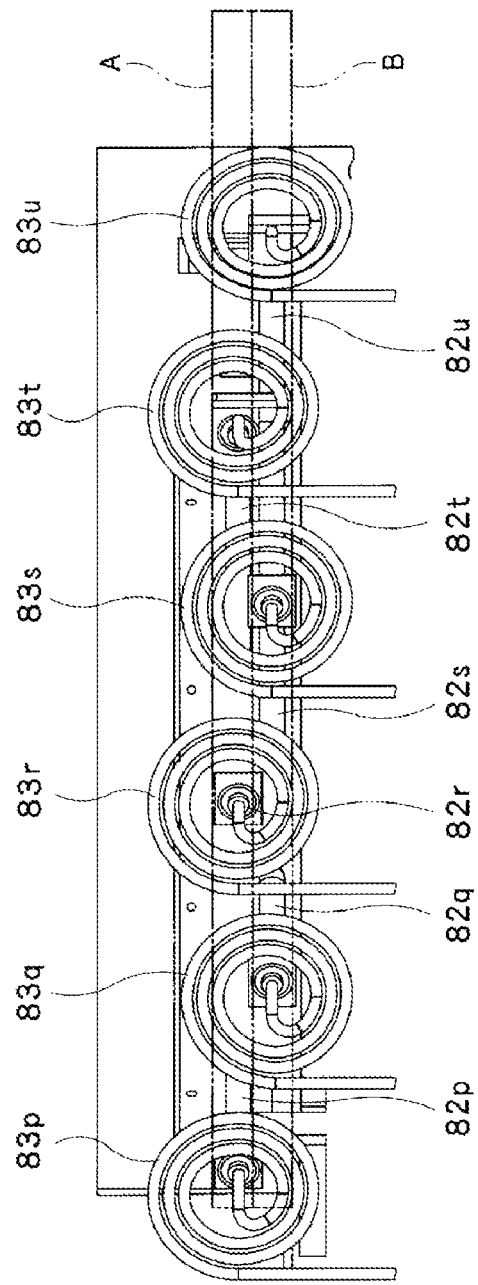
FIG. 9 is a diagram illustrating a configuration of each of the nozzle supporting arms shown in FIG. 7 viewed toward the processing chamber from the rear side of the nozzle supporting arms.

Hereinafter, the configuration of nozzle supporting arm 82 in the exemplary embodiment of the present disclosure will be described in detail with reference to FIGS. 7 and 10. Herein, FIG. 7 is a perspective view illustrating processing chamber 20 and six nozzle supporting arms 82p to 82u in liquid processing apparatus 10 shown in FIG. 2, and FIG. 8 is an enlarged perspective view of each of nozzle supporting arms 82p to 82u shown in FIG. 7. FIG. 9 is a diagram illustrating a configuration when each of nozzle supporting arms 82p to 82u shown in FIG. 7 is viewed toward processing chamber 20 from the rear side of nozzle supporting arms 82p to 82u, and FIG. 10 is a lateral cross-sectional view illustrating the configuration of each of nozzle supporting arms 82p to 82u shown in FIG. 7 in detail.

As shown in FIG. 7, six nozzle supporting arms 82 are constituted, for example, by a deionized water supplying arm 82p, a first chemical liquid supplying arm 82q, an $N_2$ gas supplying arm 82r, a second chemical liquid supplying arm 82s, a mist of deionized water supplying arm 82t, and an IPA supplying arm 82u. As described above, nozzles 82a are installed at the front ends of nozzle supporting arms 82p to 82u. Therefore, deionized water is supplied to the top surface of wafer W through nozzle 82a installed at the front end of deionized water supplying arm 82p, the first chemical liquid (specifically, for example, the acid chemical liquid) is supplied to the top surface of wafer W through nozzle 82a installed at the front end of first chemical liquid supplying arm 82q, and $N_2$ gas is supplied to the top surface of wafer W through nozzle 82a installed at the front end of $N_2$ gas supplying arm 82r. Further, the second chemical liquid (specifically, for example, the alkaline chemical liquid) is supplied to the top surface of wafer W through nozzle 82a installed at the front end of second chemical liquid supplying arm 82s, mist of deionized water is supplied to the top surface of wafer W through nozzle 82a installed at the front end of mist of deionized water supplying arm 82t, and IPA is supplied to the top surface of wafer W through nozzle 82a installed at the front end of IPA supplying arm 82u.

Figure 10:
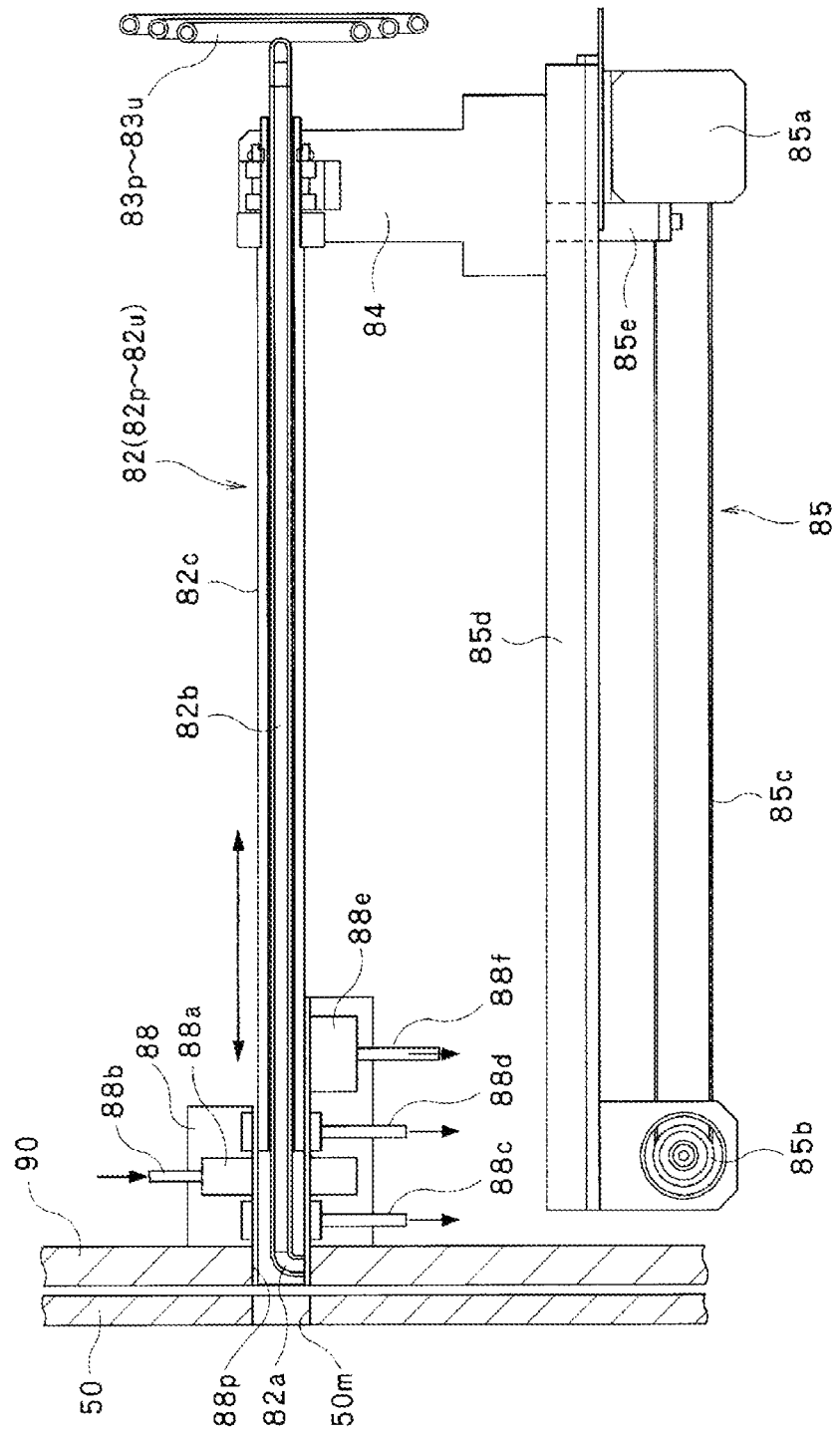
FIG. 10 is a side cross-sectional view specifically illustrating a configuration of the nozzle supporting arm shown in FIG. 7.

As shown in FIGS. 8 and 10, an arm driving mechanism 85 that rectilinearly moves nozzle supporting arm 82 is installed in each of nozzle supporting arms 82. Arm driving mechanism 85 includes a motor 85a attached to a base member 85d and rotating forwardly and reversely, a pulley 85b attached to base member 85d to face motor 85a, a circulation belt 85c wound on motor 85a and pulley 85b, and a belt attachment member 85e attached to circulation belt 85c. Herein, belt attachment member 85e is attached to the lower part of arm supporting unit 84 that supports nozzle supporting arm 82, and belt attachment member 85e and arm supporting unit 84 move integrally with each other. In arm driving mechanism 85, as circulation belt 85c is moved in a right or left direction in FIG. 10 by rotating motor 85a, belt attachment member 85e attached to circulation belt 85c moves in the right or left direction in FIG. 10, and as a result, arm supporting unit 84 moves rectilinearly in the left and right direction of FIG. 10. Therefore, nozzle supporting arm 82 supported by arm supporting unit 84 also moves rectilinearly in the left and right direction of FIG. 10.

In liquid processing apparatus 10 of the exemplary embodiment of the present disclosure, arm driving mechanism 85 is installed outside processing chamber 20 to suppress infiltration of dust generated from arm driving mechanism 85 into processing chamber 20. The atmosphere in processing chamber 20 may be suppressed from reaching arm driving mechanism 85.

As shown in FIG. 9, among six nozzle supporting arms 82p to 82u described above, deionized water supplying arm 82p, $N_2$ gas supplying arm 82r, and mist of deionized water supplying arm 82t are installed at the same height level. More specifically, in FIG. 9, nozzle supporting arms 82p, 82r, and 82t are installed at a height level of an area surrounded by two-dot chain line A in FIG. 9. Meanwhile, among six nozzle supporting arms 82p to 82u described above, first chemical liquid supplying arm 82q, second chemical liquid supplying arm 82s, and IPA supplying arm 82u are also installed at the same height level. More specifically, in FIG. 9, nozzle supporting arms 82q, 82s, and 82u are installed at a height level of an area surrounded by two-dot chain line B in FIG. 9. As shown in FIG. 9, deionized water supplying arm 82p, $N_2$ gas supplying arm 82r, and mist of deionized water supplying arm 82t are installed at positions higher than first chemical liquid supplying arm 82q, second chemical liquid supplying arm 82s, and IPA supplying arm 82u.

In liquid processing apparatus 10 of the exemplary embodiment of the present disclosure, when plurality of nozzle supporting arms 82p to 82u having different height levels advance into processing chamber 20 simultaneously, corresponding nozzle supporting arms are prevented from colliding or interfering with each other.

In liquid processing apparatus 10 of the exemplary embodiment of the present disclosure, when drying wafer W, IPA is supplied to wafer W held by holding unit 21 in processing chamber 20 and thereafter, $N_2$ gas is supplied to a location of wafer W to which IPA is supplied. In this case, $N_2$ gas supplying arm 82r and IPA supplying arm 82u advance into processing chamber 20 simultaneously. Herein, as described above, $N_2$ gas supplying arm 82r and IPA supplying arm 82u have different height levels from each other. More specifically, $N_2$ gas supplying arm 82r is installed at the height level of the area surrounded by two-dot chain line A in FIG. 9, while IPA supplying arm 82u is installed at the height level of the area surrounded by two-dot chain line B in FIG. 9.

In processing chamber 20, IPA supplying arm 82u and $N_2$ gas supplying arm 82r move in processing chamber 20 so that an area on wafer W to which $N_2$ gas is ejected from nozzle 82a installed in $N_2$ gas supplying arm 82r follows an area on wafer W to which IPA is ejected from nozzle 82a installed in IPA supplying arm 82u. In this case, since $N_2$ gas supplying arm 82r and IPA supplying arm 82u have different height levels from each other, arms 82r and 82u do not interfere with each other. Therefore, IPA is supplied to wafer W from nozzle 82a installed in IPA supplying arm 82u that advances into processing chamber 20 and thereafter, $N_2$ gas is supplied to the location on wafer W to which IPA is supplied, from nozzle 82a installed in $N_2$ gas supplying arm 82r that advances into processing chamber 20.

As another example, at the time of processing wafer W with the acid or alkaline chemical liquid, after the chemical liquid is supplied to wafer W held by holding unit 21 in processing chamber 20, deionized water is continuously supplied to wafer W without stopping, which is rinsed. In this case, first chemical liquid supplying arm 82q (alternatively, second liquid chemical supplying arm 82s) and deionized water supplying arm 82p advance into processing chamber 20 simultaneously. Herein, as described above, deionized water supplying arm 82p and first chemical liquid supplying arm 82q (alternatively, second chemical liquid supplying arm 82s) have different height levels from each other. More specifically, deionized water supplying arm 82p is installed at the height level of the area surrounded by two-dot chain line A in FIG. 9, while first chemical liquid supplying arm 82q (alternatively, second chemical liquid supplying arm 82s) is installed at the height level of the area surrounded by two-dot chain line B in FIG. 9.

In processing chamber 20, deionized water supplying arm 82p and first chemical liquid supplying arm 82q (alternatively, second chemical liquid supplying arm 82s) move in processing chamber 20 so as to supply deionized water to wafer W continuously without stopping after supplying the chemical liquid to wafer W held by holding unit 21. In this case, since deionized water supplying arm 82p and first chemical liquid supplying arm 82q (alternatively, second chemical liquid supplying arm 82s) have different height levels from each other, nozzle supporting arms 82p and 82q (alternatively, nozzle supporting arms 82p and 82s) do not interfere with each other. Therefore, after the chemical liquid is supplied to wafer W from nozzle 82a installed in first chemical liquid supplying arm 82q (alternatively, second chemical liquid supplying arm 82s) that advances into processing chamber 20, deionized water is continuously supplied from nozzle 82a installed in deionized water supplying arm 82p that advances into processing chamber 20 without stopping, which is rinsed.

As shown in FIG. 10, each of nozzle supporting arms 82p to 82u has a double pipe structure. More specifically, each of nozzle supporting arms 82p to 82u is constituted by an internal pipe 82b and an external pipe 82c. Internal pipe 82b is in communication with nozzle 82a, and as a result, a fluid is delivered to nozzle 82a from internal pipe 82b. Internal pipe 82b is made of, for example, a fluorine-based resin. Internal pipe 82b is covered with external pipe 82c and external pipe 82c is formed, for example, by coating a stainless steel pipe with the fluorine-based resin.

As shown in FIGS. 8 and 10, spiral-shaped pipes 83p to 83u that are in communication with each internal pipe 82b are installed outside nozzle supporting arms 82p to 82u at the rearend sides of nozzle supporting arms 82p to 82u, respectively. Each of spiral-shaped pipes 83p to 83u is made of a flexible material. Specifically, each of spiral-shaped pipes 83p to 83u is formed, for example, by bending a pipe such as the fluorine-based resin in a spiral shape. As shown in FIGS. 7, 8, and 10, when nozzle supporting arms 82p to 82u corresponding to spiral-shaped pipes 83p to 83u are at the retreat position, each of spiral-shaped pipes 83p to 83u is configured to have a spiral shape on a plane (that is, a plane extending in the vertical direction) perpendicular to a direction in which nozzle supporting arms 82p to 82u extend. The fluid such as the chemical liquid is delivered to each of spiral-shaped pipes 83p to 83u to eject the fluid downward from nozzle 82a by passing through internal pipe 82b installed in each of nozzle supporting arms 82p to 82u. Since each of spiral-shaped pipes 83p to 83u is made of the flexible material, when nozzle supporting arms 82p to 82u advance into processing chamber 20, corresponding spiral-shaped pipes 83p to 83u are transformed from the spiral shape shown in FIG. 8 to become a conical spiral shape (a spiral shape similar to a shape in which the front end gradually becomes thin).

In liquid processing apparatus 10 of the exemplary embodiment of the present disclosure, nozzle supporting arms 82p to 82u are rotatable around longitudinal axes along movement directions of corresponding nozzle supporting arms 82p to 82u. Specifically, as shown in FIG. 8, a rotating mechanism 86 is installed in each of nozzle supporting arms 82p to 82u and each of nozzle supporting arms 82p to 82u is rotated in an arrow direction of FIG. 8 by rotating mechanism 86. By rotating each of nozzle supporting arms 82p to 82u, the direction of nozzle 82a may be changed from a downward direction as shown in FIG. 10 to a different direction. Since each of spiral-shaped pipes 83p to 83u has the spiral shape and is made of the flexible material, even when each of nozzle supporting arms 82p to 82u is rotated by rotating mechanism 86, corresponding spiral-shaped pipes 83p to 83u are smoothly transformed according to rotation of nozzle supporting arms 82p to 82u, and as a result, the rotation of nozzle supporting arms 82p to 82u is not interfered by spiral-shaped pipes 83p to 83u, respectively.

When the fluid is supplied to wafer W held by holding unit 21 by nozzle 82a, rotating mechanism 86 selectively rotates one of nozzle supporting arms 82p to 82u that supports nozzle 82a around the longitudinal axis thereof. Specifically, when nozzle 82a is close to the periphery of wafer W held by holding unit 21, nozzle supporting arms 82p to 82u rotate so that the direction of nozzle 82a is inclined obliquely in the downward direction. As a result, on the periphery of wafer W held by holding unit 21, the fluid is ejected obliquely downward from nozzle 82a to suppress spattering of a liquid on the periphery of wafer W with respect to the fluid supplied from nozzle 82a to wafer W, specifically, the liquid such as the chemical liquid. As described above, when nozzle 82a is positioned at the center of wafer W and nozzle 82a is positioned on the periphery of wafer W, rotating mechanism 86 may change the direction of nozzle 82a.

Rotating mechanism 86 rotates nozzle supporting arms 82p to 82u around the longitudinal axis so that nozzle 82a is positioned in a direction other than the downward direction, specifically, for example, an upward direction when each of nozzle supporting arms 82p to 82u moves between the advance position and the retreat position. As a result, when nozzle supporting arms 82p to 82u are moved, the liquid such as the chemical liquid can be prevented from flowing down from nozzle 82a.

As shown in FIGS. 7 and 10, in each of nozzle supporting arms 82p to 82u, arm cleaning unit 88 that cleans nozzle supporting arms 82p to 82u is installed to be fixed to each of nozzle supporting arms 82p to 82u. Each arm cleaning unit 88 is configured to clean corresponding nozzle supporting arms 82p to 82u when corresponding nozzle supporting arms 82p to 82u move. A cleaning timing of each of nozzle supporting arms 82p to 82u by each arm cleaning unit 88 may be arbitrarily set and specifically, each of nozzle supporting arms 82p to 82u is cleaned, for example, every processing, once a day or once a month.

The configuration of arm cleaning unit 88 will be described in detail with reference to FIG. 10. As shown in FIG. 10, a through-hole through which nozzle supporting arm 82 (including 82p to 82u) passes is provided in arm cleaning unit 88 to extend in the horizontal direction (the left and right direction in FIG. 10). A cross section of the through-hole is slightly larger than the cross section of nozzle supporting arm 82. A receiving part 88a that receives the cleaning liquid is installed in the through-hole. A cleaning liquid supplying pipe 88b is connected to receiving part 88a and the cleaning liquid is supplied from cleaning liquid supplying pipe 88b to receiving part 88a. When the cleaning liquid is supplied to receiving part 88a, a liquid film is diffused on the outer peripheral surface of nozzle supporting arm 82 in receiving part 88a. In arm cleaning unit 88, corresponding nozzle supporting arm 82 moves while a part of nozzle supporting arm 82 (including 82p to 82u) contacts the cleaning liquid received in receiving part 88a to clean nozzle supporting arm 82.

In arm cleaning unit 88, suction mechanisms 88c and 88d are installed at a front position closer to processing chamber 20 than receiving part 88*a* in the movement direction (the left and right direction in FIG. 10) of nozzle supporting arm 82 and a rear position further from processing chamber 20 than receiving part 88*a*, respectively. Suction mechanisms 88*c* and 88*d* suction and drain the cleaning liquid of as much as an amount that leaks when the cleaning liquid received in receiving part 88*a* leaks to the outside from receiving part 88*a*. The suction mechanism need not to be installed at both the front position and the rear position than receiving part 88*a* in the movement direction of nozzle supporting arm 82 and instead, the suction mechanism may be installed at any one side of the front position and the rear position further than receiving part 88*a* in the movement direction of nozzle supporting arm 82.

After nozzle supporting arm 82 has been cleaned, suction mechanisms 88*c* and 88*d* suck in liquid droplets attached to nozzle supporting arm 82 to dry nozzle supporting arm 82.

In arm cleaning unit 88, a drain part 88*e* that drains the liquid such as the chemical liquid that remains in internal pipe 82*b* of nozzle supporting arm 82 is installed at a rear position further than receiving part 88*a* in the movement direction of nozzle supporting arm 82. A drain pipe 88*f* is connected to drain part 88*e* and the liquid delivered to drain part 88*e* is drained through drain pipe 88*f*. Nozzle supporting arm 82 moves so that nozzle 82*a* is positioned just above drain part 88*e* to discharge the liquid such as the chemical liquid that remains in internal pipe 82*b* of nozzle supporting arm 82 to drain part 88*e* from nozzle 82*a*. Even when the liquid-processing of wafer W is terminated and thereafter, the liquid remains in internal pipe 82*b* of nozzle supporting arm 82, drain part 88*e* is installed to drain the liquid that remains in internal pipe 82*b* from internal pipe 82*b* in advance at the time of performing subsequent liquid processing by using nozzle 82*a* installed in nozzle supporting arm 82. In particular, when a high-temperature chemical liquid is supplied to wafer W from nozzle 82*a*, the liquid that remains in internal pipe 82*b* of nozzle supporting arm 82 is cooled in some cases, and as a result, the remaining cooled liquid may be discharged from internal pipe 82*b* in advance by drain part 88*e*.

Drain part 88*e* may be installed at the front position further than receiving part 88*a*, instead of the rear position further than receiving part 88*a* in the movement direction of nozzle supporting arm 82. Even in this case, nozzle supporting arm 82 moves so that nozzle 82*a* is positioned just above drain part 88*e* to discharge the chemical liquid from nozzle 82*a*, and as a result, the liquid such as the chemical liquid that remains in internal pipe 82*b* of nozzle supporting arm 82 is delivered to drain part 88*e* from nozzle 82*a*.

As shown in FIGS. 7 and 10, each arm cleaning unit 88 corresponding to each of nozzle supporting arms 82*p* to 82*u* is installed to the outer side of wall 90 installed between processing chamber 20 and arm standby unit 80. As a result, each arm cleaning unit 88 is installed outside cup peripheral case 50. Each arm cleaning unit 88 may be attached to the inner side of wall 90 rather than the outer side of wall 90. In this case, each arm cleaning unit 88 is positioned in a region between rotational cup 40 and arm standby unit 80.

In liquid processing apparatus 10 of the exemplary embodiment of the present disclosure, arm cleaning unit 88 may clean the entire nozzle supporting arm 82 or only a part of nozzle supporting arm 82. Arm cleaning unit 88 cleans the entire circumference of nozzle supporting arm 82, but is not limited thereto.

In liquid processing apparatus 10 of the exemplary embodiment of the present disclosure, when each of nozzle supporting arms 82*p* to 82*u* stands by in arm standby unit 80, each of nozzle supporting arm covers opening 88*p* of arm cleaning unit 88 of wall 90 installed between processing chamber 20 and arm standby unit 80, as shown in FIG. 2 or 10. As a result, each of nozzle supporting arms 82*p* to 82*u* serves as a lid that covers opening 88*p* of arm cleaning unit 88 of wall 90 to isolate the area in processing chamber 20 and the area in arm standby unit 80 from each other.

Each of nozzle supporting arms 82*p* to 82*u* may cover even opening 50*m* of cup peripheral case 50 which is at the upper position shown in FIG. 5. As a result, the area in cup peripheral case 50 and the area in arm standby unit 80 may be isolated from each other.

Next, an operation of liquid processing apparatus 10 having the configuration will be described.

First, lift-pin plate 22 and processing liquid supplying pipe 28 in holding unit 21 are moved from the position shown in FIG. 4 upward and shutter 94 installed in opening 94*a* of processing chamber 20 is retreated from opening 94*a* to open opening 94*a*. Wafer W is transferred into processing chamber 20 from the outside of liquid processing apparatus 10 through opening 94*a* by transfer arm 104 and placed on lift pins 23 of lift-pin plate 22 and thereafter, transfer arm 104 retreats from processing chamber 20. In this case, cup peripheral case 50 is disposed at the lower position as shown in FIG. 4. Each of nozzle supporting arms 82 is positioned at the retreat position of retreating from processing chamber 20. That is, each of nozzle supporting arms 82 stands by in arm standby unit 80. The gas such as clean air is delivered to processing chamber 20 from FFU 70 in the down-flow mode continuously and exhausted by exhaust unit 54 to substitute the atmosphere in processing chamber 20.

Next, lift-pin plate 22 and processing liquid supplying pipe 28 are moved downward to be positioned at the lower position shown in FIG. 4. In this case, each of holding members 25 installed on holding plate 26 supports wafer W on lift pins 23 to slightly separate wafer W from lift pins 23.

Thereafter or during lowering lift-pin plate 22, cup peripheral case 50 is moved to the upper side by driving mechanism 50*b* installed in cup peripheral case 50 to position cup peripheral case 50 at the upper position shown in FIG. 5. After cup peripheral case 50 is moved to the upper position, one or plural nozzle supporting arms 82 of six nozzle supporting arms 82 that stand by in arm standby unit 80 advance into processing chamber 20 through opening 88*p* of arm cleaning unit 88 of wall 90 and one of openings 50*m* of cup peripheral case 50 (see two-dot chain line of FIG. 5). In this case, nozzle supporting arm 82 is rectilinearly moved by arm driving mechanism 85.

Holding plate 26 and lift-pin plate 22 in holding unit 21 are rotated. As a result, wafer W held by each of holding members 25 of holding plate 26 is also rotated.

Thereafter, first, wafer W held by each of holding members 25 of holding plate 26 is processed with the acid chemical liquid and subsequently rinsed. Specifically, in the state as shown in FIG. 5, both first chemical liquid supplying arm 82*q* and deionized water supplying arm 82*p* among six nozzle supporting arms 82 that stand by in arm standby unit 80 advance simultaneously into processing chamber 20 through opening 88*p* of arm cleaning unit 88 of wall 90 and opening 50*m* of cup peripheral case 50, respectively. In this case, since first chemical liquid supplying arm 82*q* and deionized water supplying arm 82*p* have different height levels from each other, nozzle supporting arms 82*q* and 82*p* do not interfere with each other.

While wafer W is being rotated, the acid chemical liquid is supplied onto the top surface of wafer W from nozzle 82*a* of first chemical liquid supplying arm 82*q* that advances into processing chamber 20. In this case, the acid chemical liquid may be supplied toward the bottom surface (rear surface) of wafer W from processing liquid supplying pipe 28. Therefore, the acid chemical liquid is supplied onto at least the top surface of wafer W to process wafer W with the chemical liquid. The acid chemical liquid supplied to wafer W is delivered and recovered to, for example, first processing liquid recovering tank 46*a* among four processing liquid recovering tanks 46*a*, 46*b*, 46*c*, and 46*d*. When the chemical liquid processing is performed as described above, deionized water supplying arm 82*p* stands by in processing chamber 20 so that nozzle 82*a* of deionized water supplying arm 82*p* is positioned slightly at a position retreating from a ejecting position of the acid chemical liquid by nozzle 82*a* of first chemical liquid supplying arm 82*q*. Herein, when deionized water supplying arm 82*p* stands by, the deionized water can be prevented from flowing down from nozzle 82*a* of deionized water supplying arm 82*p* during the chemical liquid processing by rotating deionized water supplying arm 82*p* so that nozzle 82*a* is positioned in a direction other than the downward direction, specifically, for example, the upward direction.

After the acid chemical liquid has been supplied to wafer W held by each of holding members 25 of holding plate 26, deionized water is supplied to wafer W continuously without stopping. Specifically, after the acid chemical liquid has been supplied to wafer W from nozzle 82*a* installed in first chemical liquid supplying arm 82*q* that advances into processing chamber 20, deionized water is continuously supplied to wafer W from nozzle 82*a* installed in deionized water supplying arm 82*p* that advances into processing chamber 20 without stopping. Deionized water supplied to wafer W is delivered and recovered to, for example, third processing liquid recovering tank 46*c* among four processing liquid recovering tanks 46*a*, 46*b*, 46*c*, and 46*d*. Therefore, wafer W is processed in cup peripheral case 50 with the acid chemical liquid and thereafter, wafer W is rinsed. In this case, since deionized water supplying arm 82*p* and first chemical liquid supplying arm 82*q* have different height levels from each other in processing chamber 20, nozzle supporting arms 82*q* and 82*p* do not interfere with each other. When the processing of wafer W with the acid chemical liquid and the rinsing of wafer W are terminated, first chemical liquid supplying arm 82*q* that has advanced into processing chamber 20 retreats from processing chamber 20 to stand by in arm standby unit 80. Meanwhile, deionized water supplying arm 82*p* remains in processing chamber 20. While the rinsing is performed, second chemical liquid supplying arm 82*s* advances into processing chamber 20 through opening 88*p* of arm cleaning unit 88 of wall 90 and one of openings 50*m* of cup peripheral case 50. More specifically, when the rinsing is performed as described above, second chemical liquid supplying arm 82*s* stands by in processing chamber 20 so that nozzle 82*a* of second chemical liquid supplying arm 82*s* is positioned slightly at a position retreating from a ejecting position of deionized water by nozzle 82*a* of deionized water supplying arm 82*p*.

Thereafter, wafer W held by each of holding members 25 of holding plate 26 is processed with the alkaline chemical liquid and thereafter, rinsed. Specifically, the processing of wafer W with the alkaline chemical liquid and the rinsing of wafer W are performed by second chemical liquid supplying arm 82*s* and deionized water supplying arm 82*p* that advance into processing chamber 20. In this case, since second chemical liquid supplying arm 82*s* and deionized water supplying arm 82*p* have different height levels from each other, nozzle supporting arms 82*s* and 82*p* do not interfere with each other.

Specifically, while wafer W is being rotated, the alkaline chemical liquid is supplied onto the top surface of wafer W from nozzle 82*a* of second chemical liquid supplying arm 82*s* that advances into processing chamber 20. In this case, the alkaline chemical liquid may be supplied toward the bottom surface (rear surface) of wafer W from processing liquid supplying pipe 28. Therefore, the alkaline chemical liquid is supplied onto at least the top surface of wafer W to process wafer W with the chemical liquid. The alkaline chemical liquid supplied to wafer W is delivered and recovered to, for example, second processing liquid recovering tank 46*b* among four processing liquid recovering tanks 46*a*, 46*b*, 46*c*, and 46*d*. When the chemical liquid processing is performed as described above, deionized water supplying arm 82*p* stands by in processing chamber 20 so that nozzle 82*a* of deionized water supplying arm 82*p* is positioned slightly at a position retreating from a ejecting position of the alkaline chemical liquid by nozzle 82*a* of second chemical liquid supplying arm 82*s*.

After the alkaline chemical liquid has been supplied to wafer W held by each of holding members 25 of holding plate 26, deionized water is supplied to wafer W continuously without stopping. Specifically, after the alkaline chemical liquid is supplied to wafer W from nozzle 82*a* installed in second chemical liquid supplying arm 82*s* that advances into processing chamber 20, deionized water is continuously supplied to wafer W from nozzle 82*a* installed in deionized water supplying arm 82*p* that advances into processing chamber 20 without stopping. Deionized water supplied to wafer W is delivered and recovered to, for example, third processing liquid recovering tank 46*c* among four processing liquid recovering tanks 46*a*, 46*b*, 46*c*, and 46*d*. Therefore, wafer W is processed in cup peripheral case 50 with the alkaline chemical liquid and rinsed thereafter. When the processing of wafer W with the alkaline chemical liquid and the rinsing of wafer W are terminated, second chemical liquid supplying arm 82*s* and deionized water supplying arm 82*p* that have advanced to processing chamber 20 retreat from processing chamber 20 to stand by in arm standby unit 80. While the rinsing is performed as described above, IPA supplying arm 82*u* advances into processing chamber 20 through opening 88*p* of arm cleaning unit 88 of wall 90 and one of openings 50*m* of cup peripheral case 50. More specifically, when the rinsing is performed as described above, IPA supplying arm 82*u* stands by in processing chamber 20 so that nozzle 82*a* of corresponding IPA supplying arm 82*u* is positioned slightly at a position retreating from an ejecting position of deionized water by nozzle 82*a* of deionized water supplying arm 82*p*.

Thereafter, wafer W held by each of holding members 25 of holding plate 26 is dried with IPA. Specifically, $N_2$ gas supplying arm 82*r* among six nozzle supporting arms 82 that stand by in arm standby unit 80 advances into processing chamber 20 through opening 88*p* of arm cleaning unit 88 of wall 90 and one of openings 50*m* of cup peripheral case 50. Therefore, each of $N_2$ gas supplying arm 82*r* and IPA supplying arm 82*u* advances into processing chamber 20. In this case, since $N_2$ gas supplying arm 82*r* and IPA supplying arm 82*u* have different height levels from each other, nozzle supporting arms 82*r* and 82*u* do not interfere with each other.

While wafer W is being rotated, IPA is supplied to wafer W from nozzle 82*a* installed in IPA supplying arm 82*u* that advances into processing chamber 20 and thereafter, $N_2$ gas is supplied to the location on wafer W to which IPA is supplied from nozzle 82*a* installed in $N_2$ gas supplying arm 82*r* that advances into processing chamber 20. Specifically, in processing chamber 20, IPA is supplied to the center of wafer W by nozzle 82*a* installed in IPA supplying arm 82*u*. Thereafter, IPA supplying arm 82*u* moves to the periphery from the center of wafer W and IPA supplying arm 82*u* and $N_2$ gas supplying arm 82r move on wafer W so that an area on wafer W to which gas is ejected by nozzle 82a installed in N$_2$ gas supplying arm 82r follows an area on wafer W to which IPA is supplied. Therefore, N$_2$ gas is immediately supplied to the location on the surface of wafer W to which IPA is supplied to appropriately dry wafer W. IPA supplied to wafer W is delivered and recovered to, for example, fourth processing liquid recovering tank 46d among four processing liquid recovering tanks 46a, 46b, 46c, and 46d. When the drying of wafer W is terminated, IPA supplying arm 82u and N$_2$ gas supplying arm 82r that have advanced into processing chamber 20 retreat from processing chamber 20 to stand by in arm standby unit 80.

When the drying of the wafer is terminated, cup peripheral case 50 is moved downward by driving mechanism 50b installed in cup peripheral case 50 to position cup peripheral case 50 at the lower position as shown in FIG. 4.

Thereafter, lift-pin plate 22 and processing liquid supplying pipe 28 in holding unit 21 are moved upward from the position as shown in FIG. 4. In this case, wafer W held by holding members 25 of holding plate 26 is transferred onto lift pins 23 of lift-pin plate 22. Next, shutter 94 installed in opening 94a of processing chamber 20 retreats from opening 94a to open opening 94a. Transfer arm 104 advances into processing chamber 20 through opening 94a from the outside of liquid processing apparatus 10 and wafer W on lift pin 23 of lift-pin plate 22 is transferred to transfer arm 104. Wafer W transferred to transfer arm 104 is transferred to the outside of liquid processing apparatus 10. As such, a series of the liquid-processing of wafer W is completed.

Each of nozzle supporting arms 82 may be cleaned by arm cleaning unit 88 when nozzle supporting arm 82 is moved to the retreat position in arm standby unit 80 from processing chamber 20. Each of nozzle supporting arms 82 may be cleaned after each processing of wafer W or periodically.

As described above, according to liquid processing apparatus 10 of the exemplary embodiment, the plurality of nozzle supporting arms 82p to 82u are installed and a first group of nozzle supporting arms 82p, 82r, and 82t have different height levels from a second group of nozzle supporting arms 82q, 82s, and 82u. As a result, two or more nozzle supporting arms 82p to 82u can be prevented from colliding with each other even though the two or more nozzle supporting arms 82p to 82u advance into processing chamber 20.

In liquid processing apparatus 10 of the exemplary embodiment, plurality of nozzle supporting arms 82p to 82u may advance into processing chamber 20 simultaneously.

Specifically, when N$_2$ gas is supplied to a location on wafer W to which IPA is supplied after the IPA has been supplied to wafer W held by holding unit 21, IPA supplying arm 82u and N$_2$ gas supplying arm 82r may advance into processing chamber 20 simultaneously. Therefore, N$_2$ gas is successively supplied to the location on the surface of wafer W to which the IPA has been supplied to appropriately dry wafer W.

When deionized water is supplied to wafer W successively after an acid or alkaline chemical liquid has been supplied to wafer W held by holding unit 21, first chemical liquid supplying arm 82q (alternatively, second chemical liquid supplying arm 82s) and deionized water supplying arm 82p may advance into processing chamber 20. As a result, the supply of the deionized water to wafer W may be initiated right after the supply of the chemical liquid is completed. That is, rinsing process may be continuously performed after processing with a chemical liquid without drying wafer W.

When wafer W is dried successively after deionized water has been supplied to wafer W held by holding unit 21, deionized water supplying arm 82p and IPA supplying arm 82u may advance into processing chamber 20 simultaneously. As a result, the supply of the IPA to wafer W may be initiated right after the supply of the deionized water is completed. That is, drying process with IPA may be continuously performed after rinsing process without drying wafer W.

The liquid processing apparatus according to the exemplary embodiment of the present disclosure is not limited to the aspect described above, but may be modified in various ways. For example, the processing liquid may be supplied to only the top surface of wafer W by nozzle 82a of nozzle supporting arm 82 rather than supplying the processing liquid to both the top surface and the bottom surface of wafer W by nozzle 82a of nozzle supporting arm 82 that advances into processing chamber 20 and processing liquid supplying pipe 28.

A plurality of nozzles 82a may be installed with respect to one nozzle supporting arm 82.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a processing chamber having a substrate holding unit configured to hold a substrate and a cup disposed around the substrate holding unit;
   a plurality of nozzles each configured to supply a fluid to the substrate held by the substrate holding unit;
   a plurality of nozzle supporting arms provided in a horizontal direction each configured to support one of the plurality of nozzles and be movable horizontally between an advance position advancing into the processing chamber and a retreat position retreating from the processing chamber;
   a plurality of arm driving mechanisms provided in a horizontal direction each configured to rectilinearly move one of the plurality of nozzle supporting arms independently from each other for each of the plurality of nozzle supporting arms between the advance position and the retreat position such that each of the plurality nozzle supporting arms is configured to move independently between the advance position and the retreat position only by a rectilinear movement of the plurality of arm driving mechanisms;
   an arm standby unit installed adjacent to the processing chamber and configured for the plurality of nozzle supporting arms retreating from the processing chamber to stand by such that the plurality of nozzle supporting arms are completely isolated from the processing chamber after retreating from the processing chamber; and
   a wall installed between the processing chamber and the arm standby unit to extend vertically,
   wherein at least one nozzle supporting arm is configured to have a different height level from other nozzle supporting arms both in the retreat position in the arm standby unit and in the advance position in the processing chamber in order to avoid an interference between the at least one nozzle supporting arm and other nozzle supporting arms when each of the plurality of nozzle supporting arms moves simultaneously in the processing chamber only by the rectilinear movement of the sluralit of driving mechanisms to be placed in the processing chamber simultaneously above the substrate.

2. The liquid processing apparatus of claim 1, wherein a first nozzle supporting arm that supports a first nozzle for supplying a first fluid has a different height level from a second nozzle supporting arm that supports a second nozzle for supplying a second fluid of a different type from the first fluid, and when the second fluid is supplied to a location on a substrate to which the first fluid is supplied after the first fluid has been supplied to the substrate held by the substrate holding unit, the first nozzle supporting arm and the second nozzle supporting arm advance into the processing chamber simultaneously.

3. The liquid processing apparatus of claim 2, wherein the first fluid is IPA, the second fluid is gas, and the IPA is supplied to the substrate held by the substrate holding unit as the first fluid, and thereafter, the gas is supplied as the second fluid to a location on the substrate to which the IPA is supplied to dry the substrate while the first nozzle supporting arm and the second nozzle supporting arm move on the substrate such that an area on the substrate to which the gas is ejected follows an area on the substrate to which the IPA is supplied.

4. The liquid processing apparatus of claim 1, wherein a first nozzle supporting arm that supports a first nozzle for supplying a first fluid has a different height level from a second nozzle supporting arm that supports a second nozzle for supplying a second fluid of a different type from the first fluid, and when the second fluid is supplied to a substrate continuously after the first fluid has been supplied to the substrate held by the substrate holding unit, the first nozzle supporting arm and the second nozzle supporting arm advance into the processing chamber simultaneously.

5. The liquid processing apparatus of claim 4, wherein the first fluid is a chemical liquid and the second fluid is water, and the chemical liquid and the water are successively supplied to the substrate held by the substrate holding unit so that a chemical liquid processing and a rinsing processing are performed successively with the substrate.

6. The liquid processing apparatus of claim 1, wherein each nozzle supporting arm is configured to linearly move between the inside of the processing chamber and the arm standby unit.

7. A liquid processing apparatus, comprising:
a processing chamber having a substrate holding unit configured to hold a substrate and a cup disposed around the substrate holding unit;
a plurality of nozzles each configured to supply a fluid to the substrate held by the substrate holding unit;
a plurality of nozzle supporting arms provided in a horizontal direction each configured to support one of the plurality of nozzles and be movable horizontally between an advance position advancing into the processing chamber and a retreat position retreating from the processing chamber;
a plurality of arm driving mechanisms provided in a horizontal direction each configured to rectilinearly move one of the plurality of nozzle supporting arms independently from each other for each of the plurality of nozzle supporting arms between the advance position and the retreat position such that each of the plurality of nozzle supporting arms is configured to move independently between the advance position and the retreat position only by a rectilinear movement of the plurality of arm driving mechanisms;
an arm standby unit installed adjacent to the processing chamber and configured for the plurality of nozzle supporting arms retreating from the processing chamber to stand by such that the plurality of nozzle supporting arms are completely isolated from the processing chamber after retreating from the processing chamber;
a wall installed between the processing chamber and the arm standby unit to extend vertically; and
a controller programmed to control the plurality of nozzle supporting arms and the plurality of arm driving mechanisms such that the plurality of nozzle supporting arms simultaneously advance into the processing chamber to simultaneously supply liquid from each of the plurality of nozzles,
wherein, among the plurality of nozzle supporting arms, a first nozzle supporting arm that supports a first nozzle for supplying a first fluid is configured to have a different height level from a second nozzle supporting arm that supports a second nozzle for supplying a second fluid both in the retreat position in the arm standby unit and in the advance position in the processing chamber in order to avoid an interference between the first nozzle supporting arm and the second nozzle supporting arm when the first nozzle supporting arm and the second nozzle supporting arm move simultaneously in the processing chamber only by the rectilinear movement of the of the plurality of arm driving mechanisms to be placed in the processing chamber simultaneously above the substrate, and
wherein the controller is programmed to advance the first nozzle supporting arm and the second nozzle supporting arm to the processing chamber only by the rectilinear movement, position the second nozzle supporting arm at a slightly retreated position from an ejecting position of the first nozzle supporting arm above the substrate, sequentially supply the first fluid and the second fluid from the first nozzle and the second nozzle, respectively, and retreat the first nozzle supporting arm from the processing chamber while the second nozzle supplies the second fluid in the processing chamber.

8. The liquid processing apparatus of claim 4, wherein the first nozzle supporting arm and the second nozzle supporting arm advance to the processing chamber only by the rectilinear movement, the second nozzle supporting arm is positioned at a slightly retreated position from an ejecting position of the first nozzle supporting arm above the substrate, the first fluid and the second fluid are sequentially supplied from the first nozzle and the second nozzle, respectively, and the first nozzle supporting arm is retreated from the processing chamber while the second nozzle supplies the second fluid in the processing chamber.

* * * * *